United States Patent [19]

Siwiak et al.

[11] Patent Number: 5,276,912
[45] Date of Patent: Jan. 4, 1994

[54] RADIO FREQUENCY POWER AMPLIFIER HAVING VARIABLE OUTPUT POWER

[75] Inventors: Kazimierz Siwiak, Coral Springs; David H. Minasi, Plantation, both of Fla.

[73] Assignee: Motorola, Inc., Schaumburg, Ill.

[21] Appl. No.: 41,525

[22] Filed: Apr. 1, 1993

Related U.S. Application Data

[63] Continuation of Ser. No. 827,515, Jan. 24, 1992, abandoned, and Ser. No. 475,511, Feb. 6, 1990, abandoned.

[51] Int. Cl.⁵ .............................................. H04B 1/38
[52] U.S. Cl. ..................................... 455/73; 455/107; 455/116; 455/127; 455/129; 330/86; 330/284
[58] Field of Search ................... 455/69, 107, 115–; 330/51, 278, 279, 282, 284, 285, 302, 86, 124; 333/17.3, 32

[56] References Cited

U.S. PATENT DOCUMENTS

| | | |
|---|---|---|
| 3,151,295 | 9/1964 | Haviland ............... 455/69 |
| 3,708,756 | 1/1973 | Fajen ..................... 330/296 |
| 4,165,493 | 8/1979 | Harrington ........... 455/115 |
| 4,196,394 | 4/1980 | Adams .................. 455/107 |
| 4,311,972 | 1/1982 | Landt et al. ........... 333/17.3 |
| 4,320,350 | 3/1982 | Drapac .................. 330/285 |
| 4,439,744 | 3/1984 | Kumar et al. ......... 330/285 |
| 4,490,734 | 12/1984 | Yamada ................ 330/284 |
| 4,613,990 | 9/1986 | Halpern ................ 455/69 |
| 4,673,886 | 6/1987 | Bickley et al. ....... 330/284 |
| 4,707,620 | 11/1987 | Sullivan et al. ...... 333/124 |
| 4,935,705 | 6/1990 | Estanislao et al. ... 330/285 |
| 4,994,757 | 2/1991 | Bickley et al. ....... 330/285 |

FOREIGN PATENT DOCUMENTS 0314025 12/1989 Japan ........................... 455/127

OTHER PUBLICATIONS

Motorola Service Manual 68P81016C45-A, "MX300 Series, Handie-Talkie'FM Marine Radio", (1981) discloses a radio with a power amplifier having a stage of amplification that may be manually bypassed (i.e., with a toggle switch). See p. 6, Switch S303.

Primary Examiner—Reinhard J. Eisenzopf
Assistant Examiner—Andrew Faile
Attorney, Agent, or Firm—M. Mansour Ghomeshi

[57] ABSTRACT

A radio-frequency amplifier (50) has an impedance transformation network (66) with a control input (70) for controlling the transformation characteristic of the transformation network (66). The radio-frequency amplifier (50) amplifies an input signal to produce an amplified radio-frequency output signal to a load (68). The control circuit selects a power level for the output signal, in response to a control signal, by transforming the impedance of the load to a transformed impedance at the output of the radio-frequency amplifier, so that the efficiency of the radio-frequency amplifier is not substantially degraded as the power level for the output signal is changed.

3 Claims, 5 Drawing Sheets

RADIO FREQUENCY POWER AMPLIFIER HAVING VARIABLE OUTPUT POWER

This is a continuation of application Ser. No. 07/827,515, filed on Jan. 24, 1992 abandoned and Ser. No. 07/475,511 filed on Feb. 6, 1990 and now abandoned.

TECHNICAL FIELD

This invention relates in general to radio-frequency (RF) amplifiers, and more particularly to high efficiency amplifiers with variable output power.

BACKGROUND

Referring to FIG. 1, a circuit 10 represents a conventional RF power amplifier. The circuit 10 includes a field-effect transistor (FET) 14 coupled to the supply voltage $V_s$ through an RF choke 12. The FET 14 receives an RF drive at its gate 15, thus performing as an RF periodic current sink or switch. A capacitor 16 is disposed between a node 13 and a node 18 for DC blocking purposes. A bandpass filter 19, comprising an inductor 20 and a capacitor 22 is disposed between the node 18 and the load resistance 26. A matching network 24 is disposed between the node 18 and the output 26 of the power amplifier 10, to transform the impedance of the load 28 to a desired output impedance ($Z_o$) at node 18.

Ideal class C RF power amplifiers, or switch mode amplifiers (class D, E, or F) operate at an optimum output power ($P_o$) determined by the power supply voltage ($V_s$) and the operating load line ($R_L$) by the equation:

$$P_o = V_s^2 / 2R_L \qquad (1)$$

Thus, for a fixed voltage supply (as in portable radio amplifiers) output power is determined by the load line $R_L$.

RF power amplifiers of conventional design typically suffer from a significant efficiency reduction when the output power level is adjusted to values below the peak design output power by varying the input drive to the power amplifier. This is true for all classes of amplifiers: A, B, C, E, and F. Maintaining efficiency with RF output power cutback is an important requirement for radios that are designed to save battery power as a result of reduced power operation. One known option for varying output power while maintaining efficiency is to adjust the voltage supply to the amplifier stage. However, this option is inconvenient since a high efficiency DC/DC converter is required in the case of a battery powered RF amplifier.

SUMMARY OF THE INVENTION

Briefly, according to the invention, a high efficiency RF amplifier has variable output power while operating from substantially a constant voltage source. This is accomplished by varying the load impedance of the amplifier, so that the efficiency of the radio-frequency amplifier is not substantially degraded as the power level for the output signal is changed.

DETAILED DESCRIPTION OF THE PREFERRED EMBODIMENT

Figure 1:
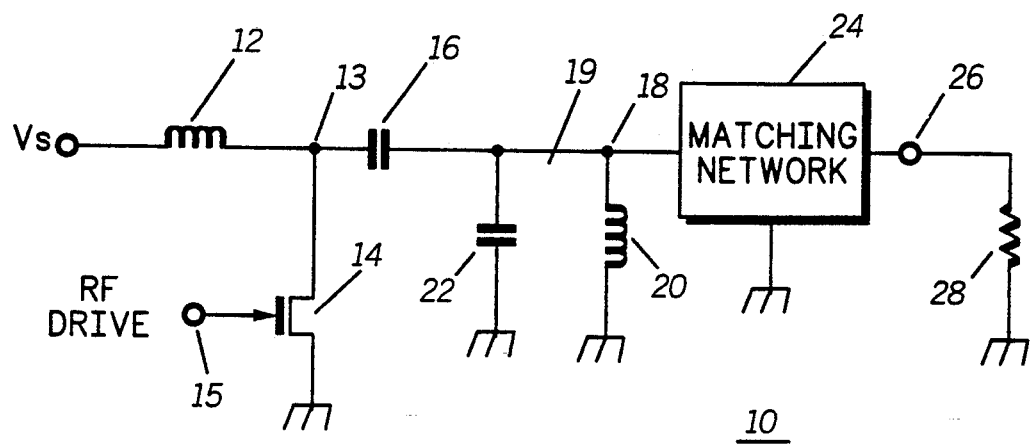
FIG. 1 is a schematic of a conventional RF power amplifier.
Figure 2:
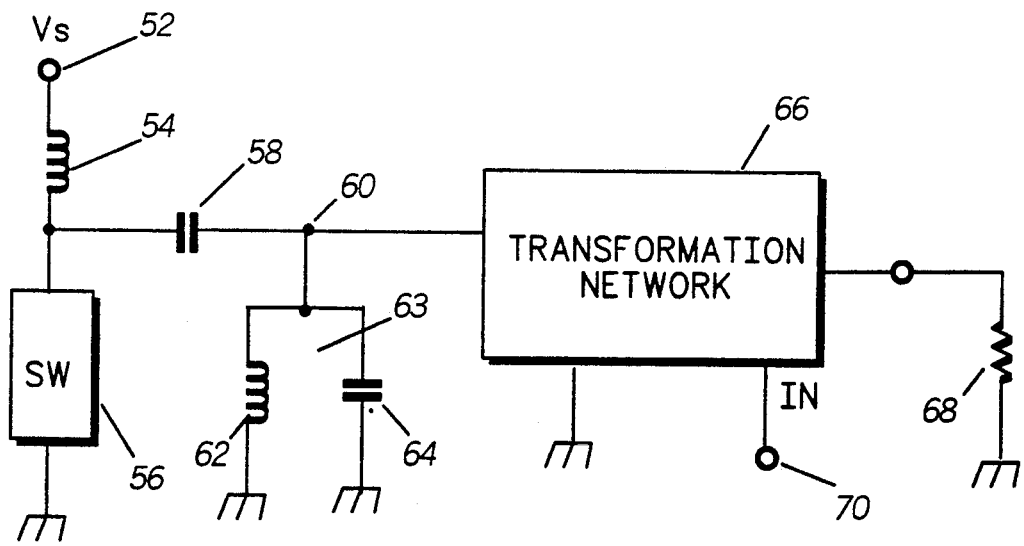
FIG. 2 is a schematic of a power amplifier having a controllable impedance transforming network, in accordance with the invention.

Referring to FIG. 2, an RF power amplifier circuit 50 in accordance with the invention is shown. The amplifier circuit 50 accomplishes a reduction in output power without a substantial reduction in efficiency. A substantially constant power supply voltage, Vs, is applied to the amplifier circuit 50 at an electrode 52. An RF periodic switch (or current sink) 56 is coupled to the power supply electrode 52 through an RF choke 54. The switch 56 is preferably a transistor operating as a periodic switch for all output power levels (yielding substantially constant efficiency). A capacitor 58 is disposed between the switch 56 and a bandpass filter 63, to block the DC voltage. The bandpass filter 63 includes an inductor 62 and a capacitor 64 coupled in parallel. A series coupled bandpass filter may also be used with equal results. An impedance transformation network 66 with N transformation states is coupled to the switch 56 through the capacitor 58 and the filter 63. The transformation network 66 accomplishes the desired output power control by proper selection of the transformation ratio of the transformation network 66. Control signals may be applied to the transformation network 66 at a control electrode 70 for changing the transfer ratio to achieve the desired output power control. Network switching may be performed by switching in or out reactive lump elements in a discrete match, for example, selecting a tapped winding on a transformation transformer, or switching in or out lumped or distributed elements in a hybrid match. The switches could be PIN diodes, transistors, electrically or mechanically activated "make/break" contacts.

Figure 3:
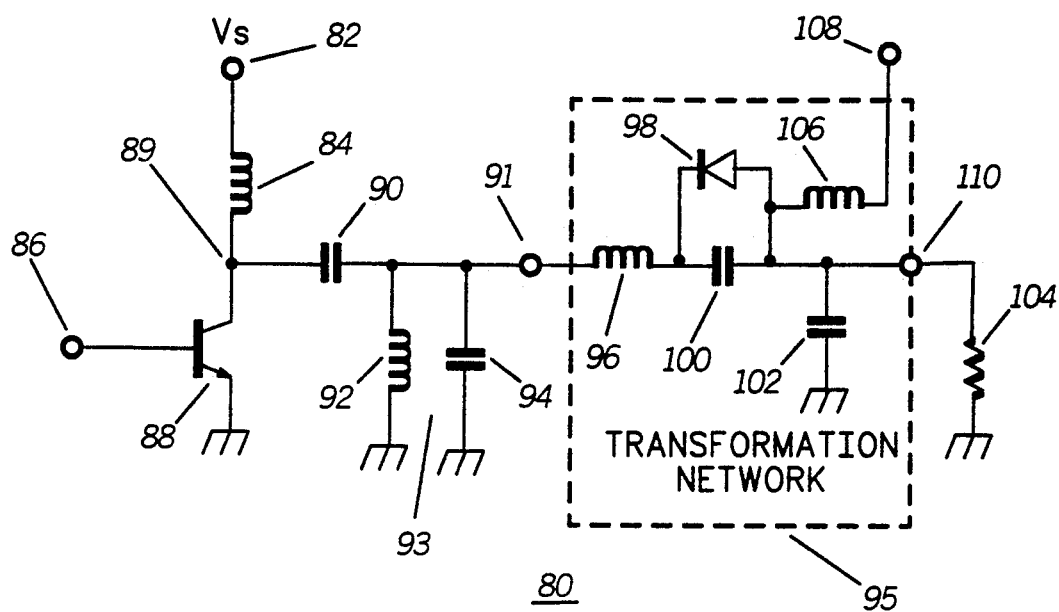
FIG. 3 is a schematic of another power amplifier having a controllable impedance transforming network, in accordance with the invention.

Referring to FIG. 3, an RF power amplifier circuit 80 in accordance with another embodiment of invention is shown. The output device in this case is a bipolar transistor 88. An RF signal is received at the base 86 of the transistor 88 for amplification thereof. As in the previously discussed circuits, an RF choke 84 is disposed between the power electrode 82 and the collector 89 of the transistor 88 to filter out RF signals. A capacitor 90 prevents DC voltages at node 89 from being established at a bandpass filter 93 (comprising an inductor 92 and a capacitor 94). The bandpass filter 93 defines the output frequency of the amplifier 80. An impedance transformation network 95 transforms the impedance of the load 104 to a desired impedance (Zo) at a node 91. The network 95 includes an inductor 96 coupled in series to a capacitor 100 and a PIN diode 98 and a capacitor 102, coupled in parallel with the load 104. An RF choke 106 is disposed between the anode of the diode 98 and a supply electrode 108, so that when a control bias voltage is applied at the electrode 108, the diode 98 conducts, thus changing the transformation characteristic of the network 95. Thus, the network 95 has two states of impedance transformation.

Figure 4:
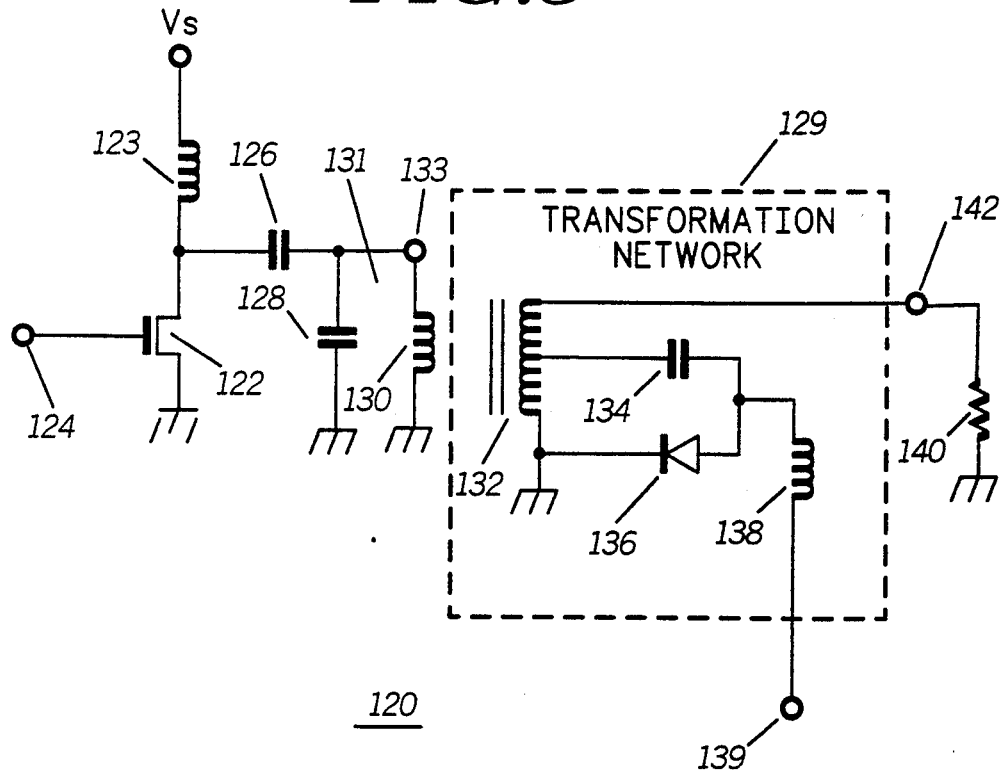
FIG. 4 is a schematic of another power amplifier in accordance with the invention.

Referring to FIG. 4, an RF power amplifier 120 in accordance with still another embodiment of the invention is shown. In this case, the output device is a Field-Effect Transistor (FET) 122. An RF signal at the gate 124 of the FET 122 is amplified. A power supply voltage Vs is applied to the drain of FET 122, through an RF choke 123. A DC blocking capacitor 126 is disposed between the drain of the FET 122 and an impedance transformation network 129. A bandpass filter 131 is disposed between the capacitor 126 and the network 129. In this embodiment the network 129 includes a transformer 132 with a capacitor 134 coupled to its center tap. A PIN diode 136 has its anode coupled to a control electrode 139 (through RF choke 138), and its cathode coupled to ground potential, so that it acts as a switch. When a sufficiently high voltage (Vc) is applied at electrode 139, the diode 136 conducts (i.e., one transformation state) and when such a voltage is not present, the network 129 is in another transformation state. Thus, the impedance at node 133 may be in one of two possible states (depending on the value of Vc) so that when less power is required at the load 140, the appropriate impedance transformation maintains the efficiency of the amplifier 120 relatively constant.

Figure 5:
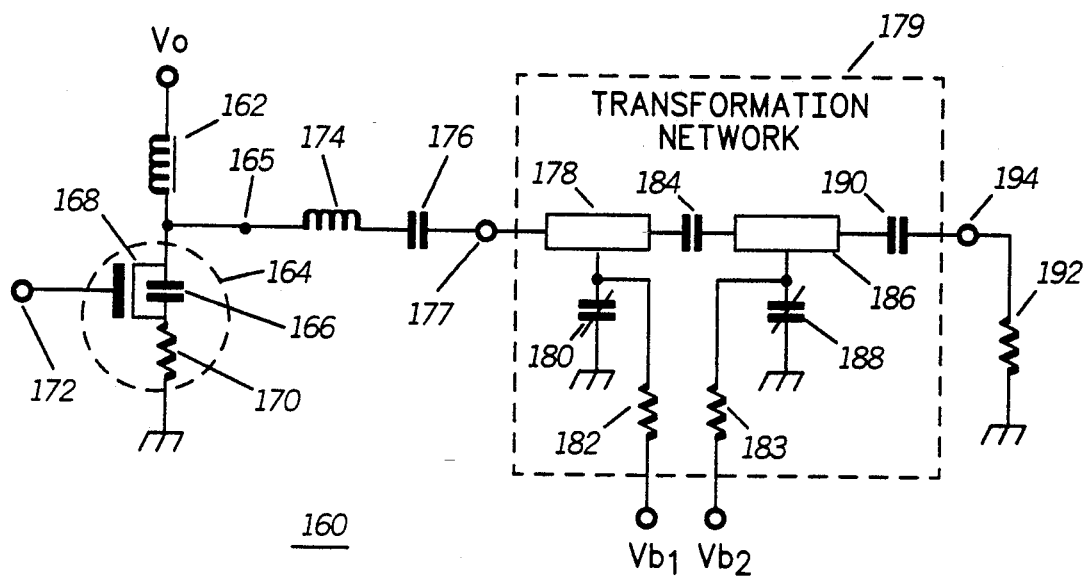
FIG. 5 is a schematic of a power amplifier in accordance with the invention.

Referring to FIG. 5, there is shown an RF power amplifier 160 having an output switch device 164. The device 164 comprises an FET 168, that is operated in a switching mode and is designed for high efficiency. The semiconductor switch device 168 is supplied through an RF choke 162 from a constant voltage source $V_o$ (such as a battery). A driving source is supplied to the input terminal (gate) 172 of the semiconductor device 168 so that device 168 operates as a switch. Inductor 174 and capacitor 176 represent a series-coupled bandpass filter at the operation frequency $F_o$ and present a high impedance elsewhere. A load resistance 192 is supplied with the RF power through a transformation network 179. This transformation network has capacitances 180 and 188, which vary with bias voltages $V_{b1}$ and $V_{b2}$ (which are applied through resistors 182 and 183). The capacitances 180 and 188 may be a varactor or, a PIN diode, or an equivalent, Each such capacitance may also be achieved by using back-to-back varactors or PIN diodes.

The switching device 168 is an imperfect switch having switch capacitance 166 and switch resistance 170, which are intrinsic to the semiconductor device. Elementary analysis shows that the output resistance at node 177 presented to the amplifier is:

$$R_o = 8cV^2/(P_{out}\pi^2) \quad (2)$$

where c is a constant depending on the circuit topology. Further straightforward analysis yields the condition for optimum efficiency operation of an imperfect switch, for which the efficiency is given by:

$$n_{opt} = 1 - 2\sqrt{ab} \quad (2\pi F_0 R_s C_s) \quad (3)$$

Figure 6:
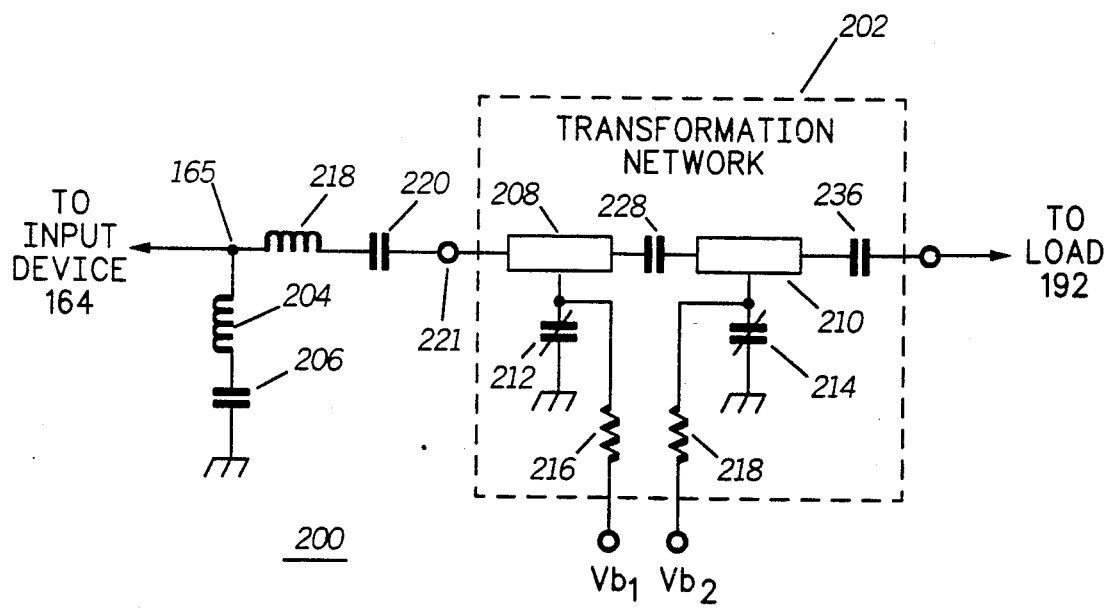
FIG. 6 is a schematic of a circuit for use with a power amplifier in accordance with the invention.

At optimum efficiency, the product ab equals 5.22 for the topology of FIG. 5 and ab equals 29.7 for the circuit of FIG. 6. The term in parenthesis is the inverse of the switch Q, where Rs is resistor 170 and Cs is capacitor 166, and Fo is the operating frequency. For the circuit of FIG. 5, c=0.2257, while for the circuit of FIG. 6, c=0.2058.

From equation (2) the output power $P_{out}$ versus optimum load resistance $R_o$ is:

TABLE 1

| $P_{out}$.watts | $R_o.\Omega$. FIG. 5 | $R_o.\Omega$. FIG. 6 |
|---|---|---|
| 0.4 | 16 | 15 |
| 0.8 | 8.2 | 7.5 |
| 1.0 | 6.6 | 6 |
| 1.3 | 5.0 | 4.6 |
| 1.6 | 4.1 | 3.8 | for $V_o = 6$ volts. $P_{out}$ and the load resistance 192 are seen to be inversely related while maintaining the condition for high efficiency.

The voltage-controlled transformation network 179 is a pair of quarter wave transmission line sections, 178 and 186, each having a voltage variable capacitance, 180, and 183, coupling the mid-points of the respective transmission lines to ground.

Referring to FIG. 6, there is shown a circuit 200 for use with the RF power amplifier 160 (of FIG. 5). An impedance transformation network 202 has a variable load transformation characteristic similar to that of the amplifier of FIG. 5. When the capacitors 212 and 214 each vary over a 2 pF range, and the two transmission lines 208 and 210 are respectively 25 Ohm and 70 Ohm sections, a continuously variable load resistance (Ro) between 5 and 16 Ohms is presented to the input device 164 for a nominal load 192 of 50 Ohms. Thus, as indicated in the table above, an output power variation of more than 3 to 1 is obtained with the circuits of FIGS. 5 and 6. Additional such transmission line sections would further increase the range of power variation.

The voltage variable capacitances may be either varactor diodes or back-biased PIN diodes. Adequate capacitance variation has been demonstrated with back-biased PIN diodes at power levels up to several watts.

The amplifier 160 is a high efficiency amplifier of the "tuned load" variety of which class E is another particular example. The amplifier 160 with the circuit 200 is a "harmonically tuned" high efficiency amplifier which is related to the Class F amplifier. Similar load variation for output power control could also be demonstrated for class C amplifiers and for Class B amplifiers. Reactances 204 and 206 represent a harmonic band network that in conjunction with the device intrinsic capacitance 166 (of FIG. 5) has a "zero" at the second harmonic band and a "pole" at the third harmonic band.

Figure 7:
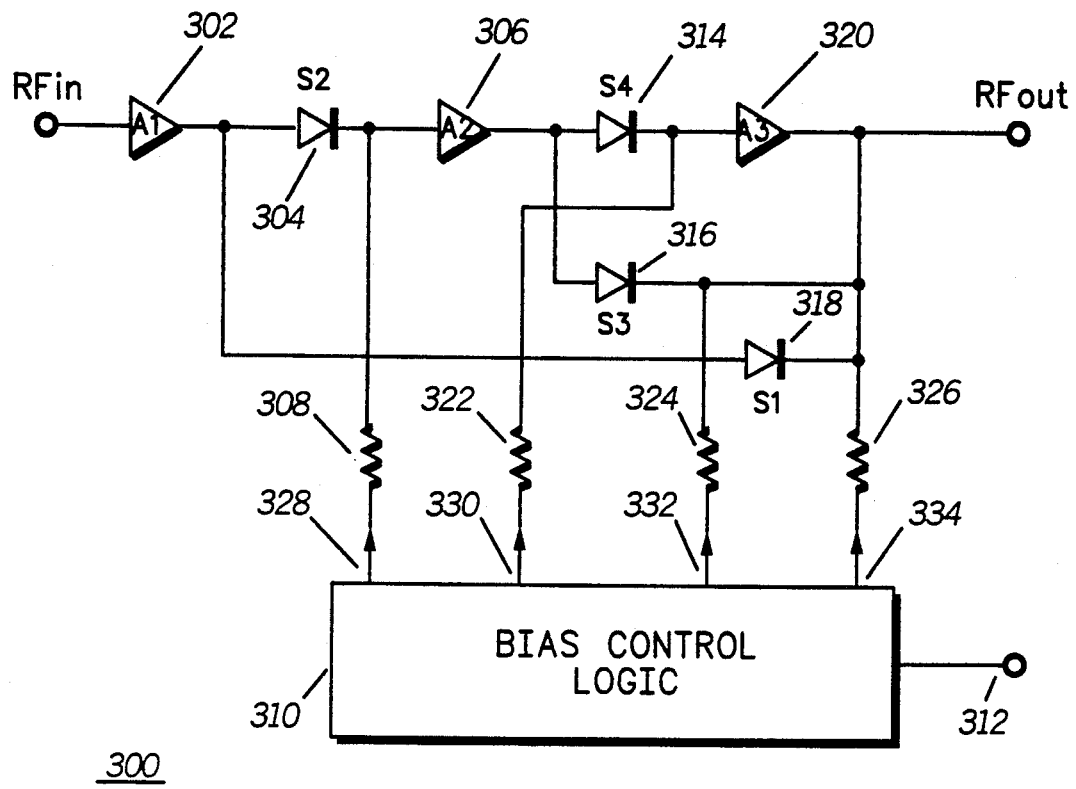
FIG. 7 is a schematic of a power amplifier having bias control logic in accordance with the invention.

Referring to FIG. 7, a three-stage RF power amplifier 300 in accordance with another embodiment of the invention is shown. Three RF amplifier stages 302, 306, and 320 are shown coupled through PIN diode switches and are arranged so that amplifier 320 or amplifiers 306 and 320 may be bypassed. PIN diodes 304, 314, 316, and 318 are biased so that they can assume the ON/OFF states shown in Table 2 for the desired power levels (full power, −9 dB, or −18 dB (typical) and amplifiers 302, 306, and 320 are each designed for optimum efficiency, three output power levels are available under logic control while high efficiency is maintained at each level.

TABLE 2

|  | S1 (318) | S2 (304) | S3 (316) | S4 (314) |
| --- | --- | --- | --- | --- |
| full power | OFF | ON | OFF | ON |
| −9 dB | OFF | ON | ON | OFF |
| −18 dB | ON | OFF | OFF | OFF |

Resistors 308, 322, 324, and 326, in conjunction with the bias control logic circuit 310 constitute biasing means for the PIN diode switches 304, 314, 316, and 318.

The bias control logic circuit 310 has an input 312 for receiving input data on the power cutback required, and four outputs 328, 330, 332 and 334, coupled to resistors 308, 322, 324, and 334, respectively, for providing the bias voltages required to bypass one or two stages of amplification. Thus, for example if one wishes to bypass amplifier 320, the input data at input 312 instructs the bias control logic circuit 310 to apply bias voltages at outputs 330 and 334, having a sufficient level to turn off diodes 318 and 314.

If each amplification stage has a constant efficiency of 14 percent (such as Motorola Inc.'s SABER radio, at full power) the required battery current is 1900 mA for 2 watts. However, the required battery current is only about 240 mA for 0.25 watts. Therefore, in such a case, RF power cutback improves battery energy usage.

The final amplification stage 320 does not have to be designed for variable output power (because it is bypassed for either a reduction of 9 dB or 18 dB). Thus, it can be designed for high efficiency, as can stages 302 and 306. Stage efficiencies of 33% are realizable easily for constant power stages, while application of high efficiency techniques can improve stage efficiency to near 50%.

Figure 8:
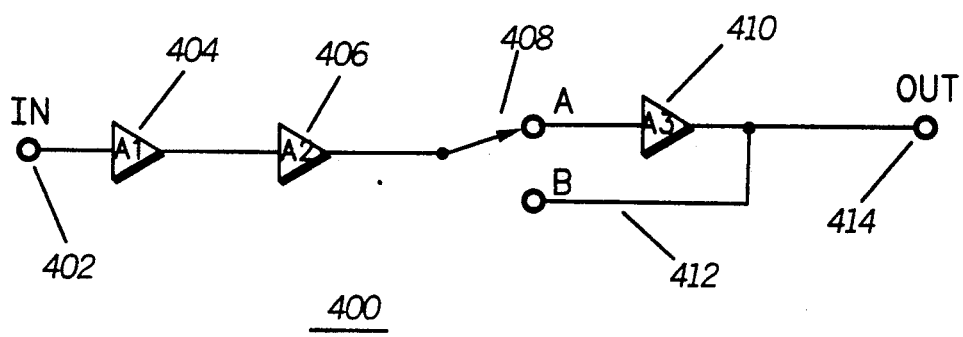
FIG. 8 is a schematic of a three-stage power amplifier circuit in accordance with the invention.

Referring to FIG. 8, another three-stage RF power amplifier is shown. In a high-power mode, a switch 408 (preferably a PIN diode switch) is in its "A" position. In a low-power mode, the switch 408 is in the "B" position, whereby the final stage is bypassed with a line 412. In either position of the switch 408, the amplifiers are optimized for efficiency.

Figure 9:
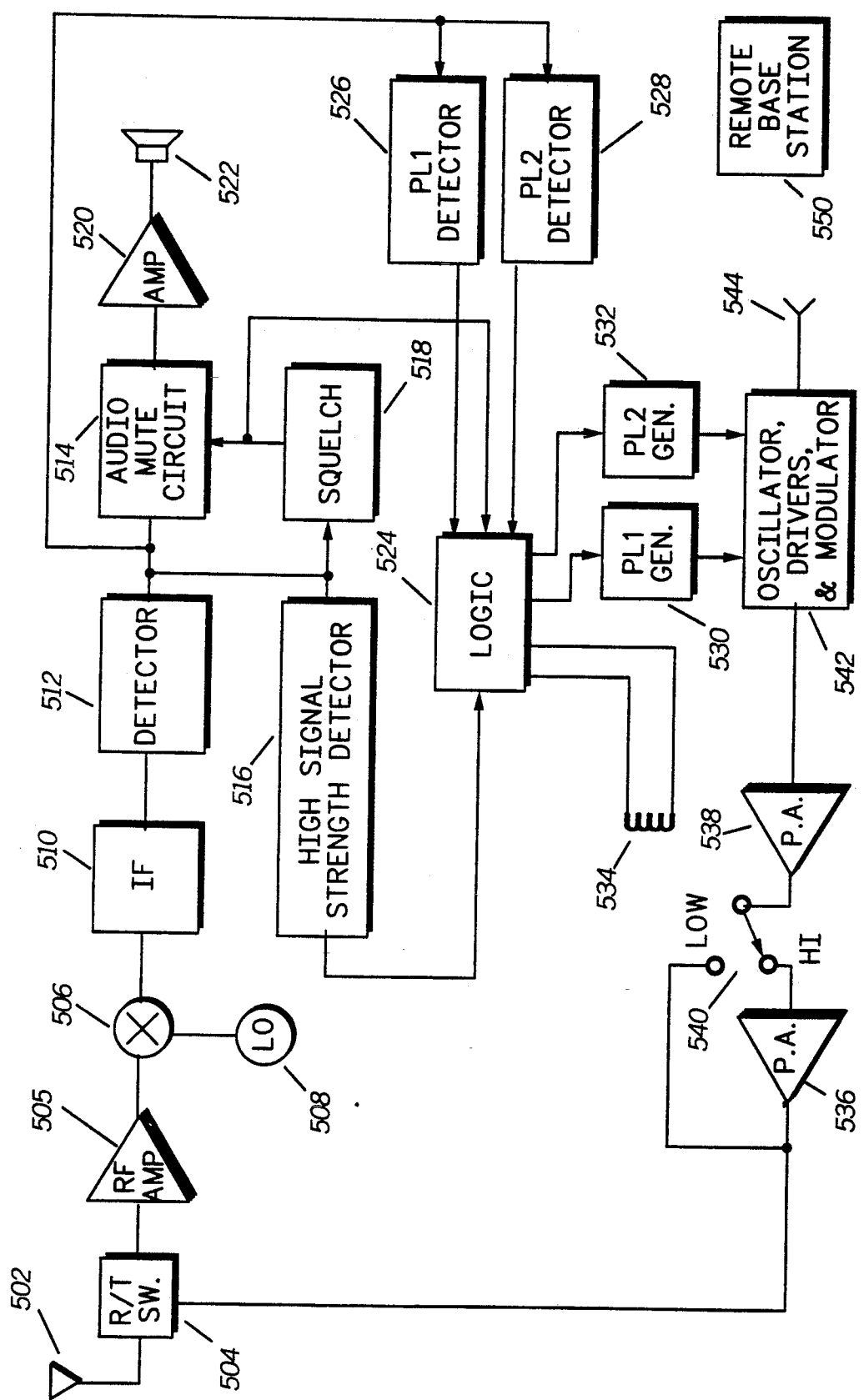
FIG. 9 is a schematic of a radio having a power amplifier in accordance with the invention.

Referring to FIG. 9, an antenna 502 receives an RF signal when the receive/transmit switch 504 is in the receive position. The RF signal is amplified by an RF amplifier 505. The amplified RF signal is then mixed by a mixer 506 with a signal produced by a local oscillator 508. The resulting intermediate frequency (IF) signal is applied to an IF filter 510. The filtered signal produced by the IF filter 510 is then applied to a detector 512 for producing a demodulated signal. A high signal strength detector 516 detects the level of the demodulated signal. In the event that the signal has a margin over 20 dB quieting, the high signal strength detector 516 provides a signal to the logic circuit 524, providing it with that information.

The demodulated signal is also sampled by a private line (PL) 1 detector 526 and by a PL 2 detector 528. The PL 1 detector 526 detects the presence or absence of a PL 1 tone in the demodulated signal. The presence of a PL 1 tone may indicate that a companion communication unit (e.g., remote base station 550 or a radio that is substantially identical to radio 500) is receiving an excessive power level of transmission from the radio 500, and thus requesting a power reduction. The PL 1 detector 526 conveys that information to the logic circuit 524.

The PL 2 detector 528 monitors the signal for a PL 2 tone that informs the radio 500 of the transmission power level of the other communication unit. For example, if the other communication unit is transmitting at a high level, it may indicate that by transmitting the PL 2 tone. Upon detecting that tone, the PL 2 detector provides a signal to the logic circuit 524 indicating the transmission power status of the received signal.

If the PL 1 detector 526 detects that the PL 1 tone is present, the PL 1 detector 526 produces a signal to the logic circuit 524 instructing it to operate on a lower power mode. Thus, the logic circuit 524 causes a relay control 534 to place the switch 540 in the low position. This causes the amplifier 536 to be decoupled from the amplifier 538 and thus a lower level of output is achieved.

When the radio 500 is in the transmit mode, the PL 2 generator 532 provides a signal to the oscillator, drivers, and modulator circuits (represented by a block 542) indicating the transmission power status of the radio 500. That information is then transmitted to the other communication unit by means of the presence or absence of a PL 2 tone in the transmitted signal. Whereas the PL 1 generator sends a signal to the circuits 542 indicating whether the other communication unit should cutback on its power output, or not. That information is then also transmitted to the other communication unit by means of the presence or absence of a PL 1 tone in the transmitted signal. Moreover, an audio input 544 receives an audio signal for modulation and transmission. The power level of the transmission is determined by the switch 540. When the switch 540 is in the high position, the output power is high because two levels of amplification are achieved (i.e., by amplifiers 536 and 538). On the other hand, when the switch 540 is in the low position only the amplifier 538 amplifies.

A squelch 518 is coupled to the detector 512 to determine whether the level of signal at that point is above a predetermined amount (i.e., whether a usable signal is produced by the detector 512). If the signal strength is not of sufficient strength, the squelch 518 causes the audio mute circuit 514 to mute the audio from the detector 512. The logic circuit 524 also monitors the output of the squelch 518 to determine whether the received signal is of a minimum level.

If the audio signal level is adequate, the amplifier 520 provides an amplified audio signal to the loudspeaker 522. On the other hand, if the received signal strength is below the desired level the squelch circuit 524 causes the PL 1 generator to indicate that a stronger signal is required from the other communication unit. If the other unit is a remote base station 550, the radio 500 does not need to send out request for higher level transmission because it always transmits at a high level.

Thus, by controlling the output power level with a stage of amplification that may be bypassed, both stages of amplification may be biased for efficient operation. Therefore, the output power level may be reduced without significant reduction in efficiency.

What is claimed is:

1. A radio-frequency amplifier circuit for providing an amplified radio-frequency signal to a load having a load impedance, the radio-frequency amplifier circuit comprising:

amplifier means for amplifying an input signal to produce the amplified radio-frequency signal to the load, the amplifier means operating in a high efficiency switching mode and having an input for receiving the input signal, and having an output to provide the amplified radio-frequency signal, the amplified radio-frequency signal having variable output power;

transformation means for transforming the load impedance of the load to a transformed impedance at the output of the amplifier means responsive to a control signal, the transformation means having a control input for receiving the control signal to set a selected power level for the amplified radio-frequency signal, the transformation means having a predetermined transforming characteristic for transforming the load impedance to allow the amplifier means to remain saturated at the selected power level, the saturation of the amplifier means provides for operation at maximum efficiency and not just maximum power transfer available with matched impedance and;

control means for providing the control signal.

2. A radio transceiver, comprising:

a radio-frequency amplifier having an input and an output, for amplifying an input signal to produce an output signal to a load, the load having a load impedance;

transformation means for transforming the load impedance of the load to a transformed impedance at the output of the amplifier means responsive to a control signal, the transformation means having a control input for receiving the control signal to set a power level from a plurality of power levels for the amplified radio-frequency signal, so that the efficiency of the radio-frequency amplifier is not substantially degraded as the power level of the output signal is reduced and the transformation means having a predetermined transforming characteristic for transforming the load impedance to allow the amplifier means to remain saturated and operate with maximum efficiency at all the plurality of power levels; and control means for providing the control signal.

3. The radio transceiver of claim 2 wherein the radio-frequency amplifier comprises:

a plurality of series-connected amplifier stages;

means for switching off and bypassing at least one of the amplifier stages in response to the control signal.

* * * * *